(12) United States Patent
Fujita et al.

(10) Patent No.: US 11,243,261 B2
(45) Date of Patent: Feb. 8, 2022

(54) BATTERY CHARGER, CHARGING METHOD, NON-TRANSITORY STORAGE MEDIUM, AND BATTERY PROVISION SYSTEM

(71) Applicant: KABUSHIKI KAISHA TOSHIBA, Minato-ku (JP)

(72) Inventors: Yumi Fujita, Chuo (JP); Tomokazu Morita, Funabashi (JP); Nobukatsu Sugiyama, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 146 days.

(21) Appl. No.: 16/563,644

(22) Filed: Sep. 6, 2019

(65) Prior Publication Data
US 2020/0284845 A1    Sep. 10, 2020

(30) Foreign Application Priority Data

Mar. 5, 2019 (JP) .............................. JP2019-039664

(51) Int. Cl.
*G01R 31/392* (2019.01)
*G01R 31/374* (2019.01)
(Continued)

(52) U.S. Cl.
CPC .......... *G01R 31/392* (2019.01); *B60L 3/0046* (2013.01); *B60L 58/13* (2019.02);
(Continued)

(58) Field of Classification Search
CPC ................ G01R 31/392; G01R 31/374; G01R 31/3842; H01M 10/4207; H01M 10/482;
(Continued)

(56) References Cited

U.S. PATENT DOCUMENTS 6,841,972 B2 *   1/2005   Koo ................... B60L 50/15
                                               320/132
9,475,480 B2 *  10/2016   Ishishita ............ B60W 20/13
(Continued)

FOREIGN PATENT DOCUMENTS

JP    2005-295694 A    10/2005
JP    2015-061445 A     3/2015
(Continued)

OTHER PUBLICATIONS

A method of Determining a Lithium-ion Battery's State of Charge, Sep. 17-20, 2009, 15th International Symposium for Design and Technology of Electronics Packages, pp. 257-260 (Year: 2009).*

(Continued)

*Primary Examiner* — M Baye Diao
(74) *Attorney, Agent, or Firm* — Oblon, McClelland, Maier & Neustadt, L.L.P.

(57) ABSTRACT

A battery charger as an embodiment of the present invention includes a charger/discharger, a measurer, an estimator, a determinator, and an outputter. The charger/discharger can charge and discharge a connected battery. The measurer measures a voltage and current of the battery during charging and generates measurement data. The estimator estimates a deterioration state of the battery on the basis of the measurement data. The determinator determines whether or not the battery is usable, on the basis of the estimated deterioration state of the battery. The outputter outputs information about the determination as to whether or not the battery is usable.

6 Claims, 6 Drawing Sheets

(51) Int. Cl.
| | |
|---|---|
| *G01R 31/3842* | (2019.01) |
| *H01M 10/42* | (2006.01) |
| *H01M 10/48* | (2006.01) |
| *H01M 10/44* | (2006.01) |
| *B60L 3/00* | (2019.01) |
| *B60L 58/13* | (2019.01) |
| *H02J 7/34* | (2006.01) |

(52) U.S. Cl.
CPC ....... *G01R 31/374* (2019.01); *G01R 31/3842* (2019.01); *H01M 10/4207* (2013.01); *H01M 10/441* (2013.01); *H01M 10/482* (2013.01); *H01M 10/486* (2013.01); *H02J 7/342* (2020.01); *H01M 2200/00* (2013.01)

(58) Field of Classification Search
CPC ........... H01M 10/441; H01M 2200/00; H01M 2220/20; H01M 10/425; H01M 10/48; H01M 10/44; B60L 3/0046; B60L 58/13; Y02T 10/70; Y02E 60/10; H02J 7/0048; H02J 7/005; H02J 7/007182; H02J 7/342
USPC .......................................................... 320/132
See application file for complete search history.

(56) References Cited

U.S. PATENT DOCUMENTS

| | | | | |
|---|---|---|---|---|
| 9,897,657 | B2* | 2/2018 | Marsili | G01R 31/3835 |
| 10,101,406 | B2* | 10/2018 | Park | G01R 31/392 |
| 10,843,574 | B2* | 11/2020 | Palmisano | G01R 31/3648 |
| 2012/0293129 | A1* | 11/2012 | Naghshtabrizi | H02J 7/0021 |
| | | | | 320/118 |
| 2012/0313562 | A1* | 12/2012 | Murao | H02J 7/0025 |
| | | | | 318/139 |
| 2015/0056478 | A1* | 2/2015 | Yamamoto | G01R 31/392 |
| | | | | 429/50 |
| 2017/0263984 | A1 | 9/2017 | Fujita et al. | |
| 2018/0259587 | A1* | 9/2018 | Oguma | H02J 7/0091 |
| 2018/0267108 | A1 | 9/2018 | Morita et al. | |

FOREIGN PATENT DOCUMENTS

| | | |
|---|---|---|
| JP | 2016-171061 A | 9/2016 |
| JP | 2017-166874 A | 9/2017 |
| JP | 2018-156739 A | 10/2018 |
| JP | 2019-57382 A | 4/2019 |
| WO | WO 2006/090636 A1 | 8/2006 |
| WO | WO 2019/058583 A1 | 3/2019 |

OTHER PUBLICATIONS https://www.honda.co.jp/news/2018/c180713.html, Start of Empirical Research on Battery Sharing Using Detachable Portable Battery and Electric Motorcycle in Indonesia, Jul. 13, 2018, Honda motor industry stock company, Panasonic Corporation, 5 total pages (with Machine Generated English Translation).
http://www.rescgroup.com/e-platform/products.html, Product Information, Battery carry 2015, 3 total pages (with Machine Generated English Translation).
https://pr.fujitsu.com/jp/news/2013/10/3.html, Fujitsu and RESC Begin Collaboration to Build the Future of Electric Vehicle, Integrating ICT with Energy, a new concept for the future of electric vehicle systems, with consolidated cloud-based management of battery information, Fujitsu Limited, RESC, Ltd., Oct. 3, 2013, 9 total pages (with Machine Generated English Translation).
https://pr.fujitsu.com/jp/news/2018/03/22.html, FOMM and Fujitsu in Alliance to Create a New Mobile Society, FOMM Corporation, Fujitsu Limited, Mar. 22, 2018, 8 total pages (with Machine Generated English Translation).
https://www.gogoro.com/, Gogoro Global, Gogoro 3 Se, 2016, 3 total pages.
https://response.jp/article/2017/09/28/300398.html, [Gogoro] "The shock of landing of a black ship on EV scooter", Sep. 28, 2017, 4 total pages.
https://www.ridegoshare.jp/, "GO! ECO! Ishigaki Island", 2019, 10 total pages.
https://response.jp/article/2018/06/18/310988.html, "Kimco to Launch EV Scotter with Replaceable Battery", Jun. 18, 2018, 6 total pages.
www.meti.go.jp_shingikai_mono_info_service_jidosha_shinjidai, "Accelerated adoption of BEV, PHEV, FCEV for decentralized energy society, improvement of infrastructure", 50 total pages.
http://askpc.panasonic.com/jp/info/180328.html, Recall company announcement, Notebook PC "Battery diagnosis and control program installation request", 2018, 6 total pages.
https://www.meti.go.jp/press/2017/03/20180328005/20180328005.html, Ministry of Economy, Trade and Industry,"A laptop computer manufacture by Panasonic Corporation will be recalled (delivery of anti-virus software)", Mar. 28, 2018, 7 total pages.

* cited by examiner

| No. | CCA CONDUCTION CONDITIONS |
|---|---|
| 1 | ELAPSED PERIOD FROM LAST CCA CONDUCTION >= 90 DAYS |
| 2 | SOC <= 30(%) |
| 3 | ELAPSED PERIOD FROM LAST CCA CONDUCTION >= 60 DAYS & SOC <= 50(%) |
| 4 | ELAPSED PERIOD FROM LAST CCA CONDUCTION >= 30 DAYS & SOC <= 40(%) |

FIG. 3

BATTERY CHARGER, CHARGING METHOD, NON-TRANSITORY STORAGE MEDIUM, AND BATTERY PROVISION SYSTEM

CROSS-REFERENCE TO RELATED APPLICATION(S)

This application is based upon and claims the benefit of priority from Japanese Patent Application No. 2019-039664, filed Mar. 5, 2019; the entire contents of which are incorporated herein by reference.

FIELD

An embodiment relates to a battery charger, a charging method, a non-transitory storage medium, and a battery provision system.

BACKGROUND

In recent years, in consideration of environmental impacts, electric vehicles driven by electricity instead of gasoline have been coming into widespread use. However, there is a problem in that while the distance able to be traveled on electricity is shorter than on gasoline, the time required for charging is long. As a solution to this problem, a system is under consideration such that an on-board battery of an electric vehicle will be replaced with a precharged battery for replacement when the on-board battery has run out of power, instead of charging as conventionally the on-board battery at a charging station.

On the other hand, it is known that nonaqueous-electrolyte secondary batteries such as lithium ion batteries widely used as on-board batteries of electric vehicles deteriorate rapidly with use, resulting in smoking, ignition, and the like. Replacement batteries are used repeatedly by many and unspecified persons, and the usage situations thereof are also various. Hence, the replacement batteries have to be checked for deterioration to prevent the use of any deteriorated batteries. However, the number of replacement batteries possessed by a charging station is limited, and which can cause a situation that there is no replacement battery to offer if it takes long time for checking replacement batteries as conventionally. That is, a situation will occur in which replacement batteries are not ready and drivers visiting the charging station are kept waiting.

BRIEF DESCRIPTION OF THE DRAWINGS

FIG. 3 is a diagram illustrating an example of CCA conduction conditions;

DETAILED DESCRIPTION

There is provided an apparatus that charges a connected battery and checks a deterioration state thereof to prevent the use of any deteriorated battery and further that reduces the time taken for the charging and checking compared to conventional apparatuses.

A battery charger as an embodiment of the present invention includes a charger/discharger, a measurer, an estimator, a determinator, and an outputter. The charger/discharger can charge and discharge a connected battery. The measurer measures a voltage and current of the battery during charging and generates measurement data. The estimator estimates a deterioration state of the battery on the basis of the measurement data. The determinator determines whether or not the battery is usable, on the basis of the estimated deterioration state of the battery. The outputter outputs information about the determination as to whether or not the battery is usable.

An embodiment will be explained in detail below with reference to the accompanying drawings. The present invention is not limited to the embodiment.

(One Embodiment of Present Invention)

Figure 1:
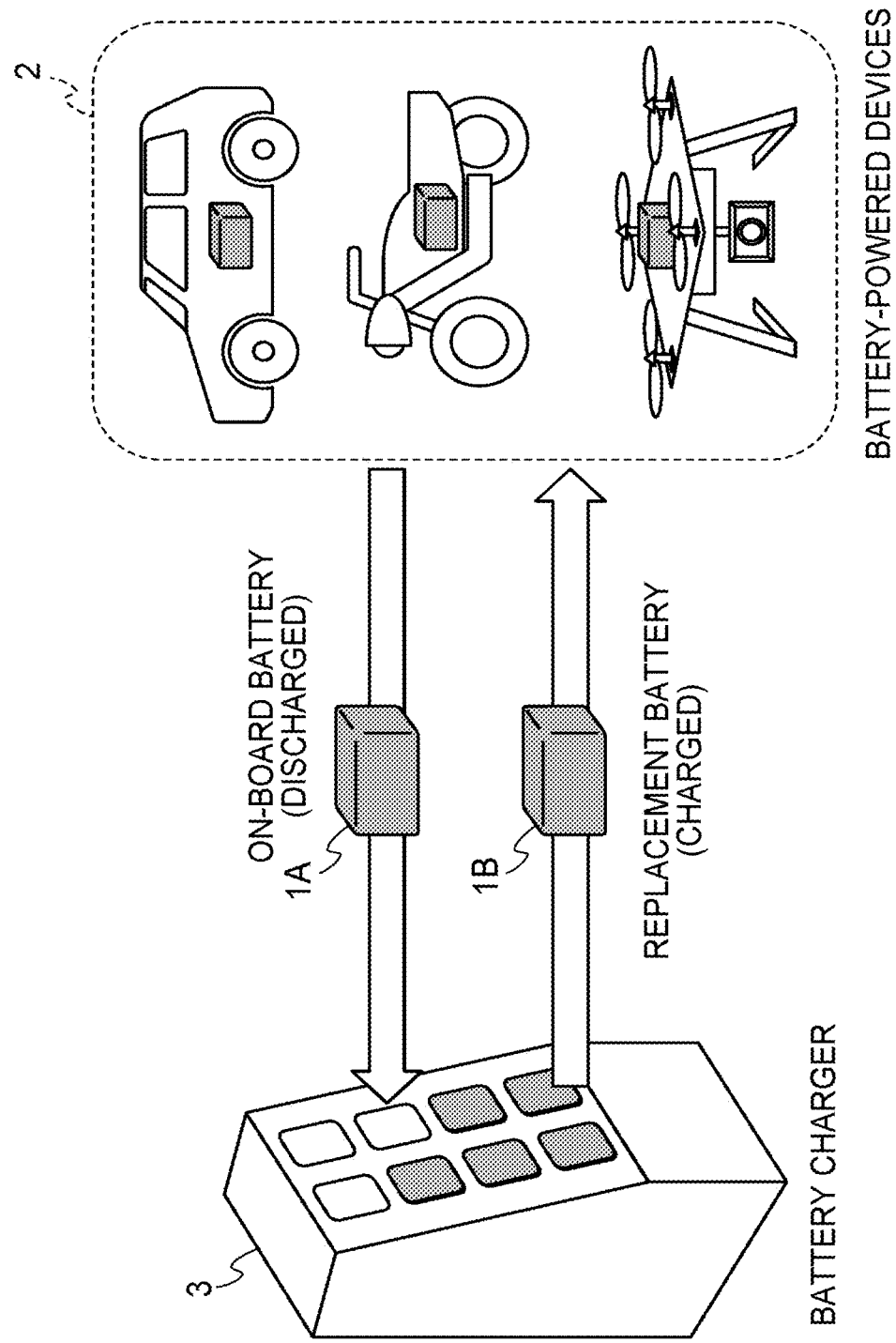
FIG. 1 is a conceptual diagram of a battery provision system including a battery charger according to an embodiment of the present invention.

FIG. 1 is a conceptual diagram of a battery provision system including the battery charger according to the embodiment of the present invention. The present battery provision system receives a battery 1A mounted on a battery-powered device 2 and provides another battery 1B charged by a battery charger 3 to the battery-powered device 2 instead of the battery 1A. Hereinafter, the battery mounted on the battery-powered device 2 will be referred to as an on-board battery 1A and the battery from the battery provision system will be referred to as a replacement battery 1B. The on-board battery 1A and replacement battery 1B are different batteries, but are of the same type.

The on-board battery 1A and replacement battery 1B are secondary batteries capable of charging and discharging. Possible examples of the batteries include, but are not limited to, a nonaqueous-electrolyte secondary battery such as a lithium ion secondary battery and a battery pack of the nonaqueous-electrolyte secondary batteries. Also, it is assumed that the on-board batteries 1A and replacement batteries 1B include battery packs and battery modules.

The battery-powered devices 2 assume devices, such as electric vehicles and drones, driven by electricity from the on-board battery 1A, but may simply be devices, such as cell phones, laptop PCs, cordless vacuum cleaners, and stationary batteries, which use the on-board battery 1A. However, the on-board battery 1A has to be removable from the battery-powered device 2 to replace batteries. Incidentally, electric vehicles include electric cars and electric motorcycles and the like.

Description will be given by assuming that the battery-powered device 2 is an electric vehicle. When power of on-board battery 1A of the electric vehicle is little left, the driver of the electric vehicle stops over at a charging station and receives a replacement battery 1B from the battery charger 3 in the charging station. The battery charger 3 is configured to be able to store plural replacement batteries 1B and charges replacement batteries 1B stored therein. Thus, the replacement batteries 1B provided from the battery charger 3 are precharged.

The driver removes the on-board battery 1A from the electric vehicle, connect the on-board battery 1A to the battery charger 3, and mount the replacement battery 1B provided by the battery charger 3 on the electric vehicle. The replacement battery 1B provided drives the electric vehicle as a new on-board battery 1A. On the other hand, the discharged on-board battery 1A connected to the battery charger 3 is charged by the battery charger 3 to become a new replacement battery 1B.

However, to ensure safety of the replacement battery 1B used repeatedly by many and unspecified persons, the battery charger 3 not only charges the replacement battery 1B, but also estimates the deterioration state of the replacement battery 1B. Then, on the basis of the estimated deterioration state, the battery charger 3 determines whether or not the replacement battery 1B is usable. Consequently, any replacement battery 1B having become dangerous due to deterioration is prevented from being used. The replacement battery 1B determined not to have been deteriorated, i.e., determined to be safe is provided to the driver after being charged. On the other hand, any replacement battery 1B not determined to be safe is not provided as unusable. For example, it is conceivable that the replacement battery 1B determined as unusable is made unremovable from the battery charger.

Various methods are available for use in estimating the deterioration state, but if time is taken for the estimation, a situation can occur in which replacement batteries 1B are not ready and drivers visiting the charging station are kept waiting. To prevent such a situation, the battery charger 3 of the present embodiment estimates the deterioration state using charging curve analysis (CCA).

On the basis of measurement data taken during charging or discharging of a battery, the charging curve analysis allows an internal state and the like of the battery to be estimated. That is, a situation in which charging cannot be performed until the deterioration state is estimated can be eliminated. Thus, even if both estimation of the deterioration state and charging are performed, the time taken until a replacement battery 1B becomes available can be reduced. In this way, the replacement battery 1B can be charged effectively with checking safety.

Figure 2:
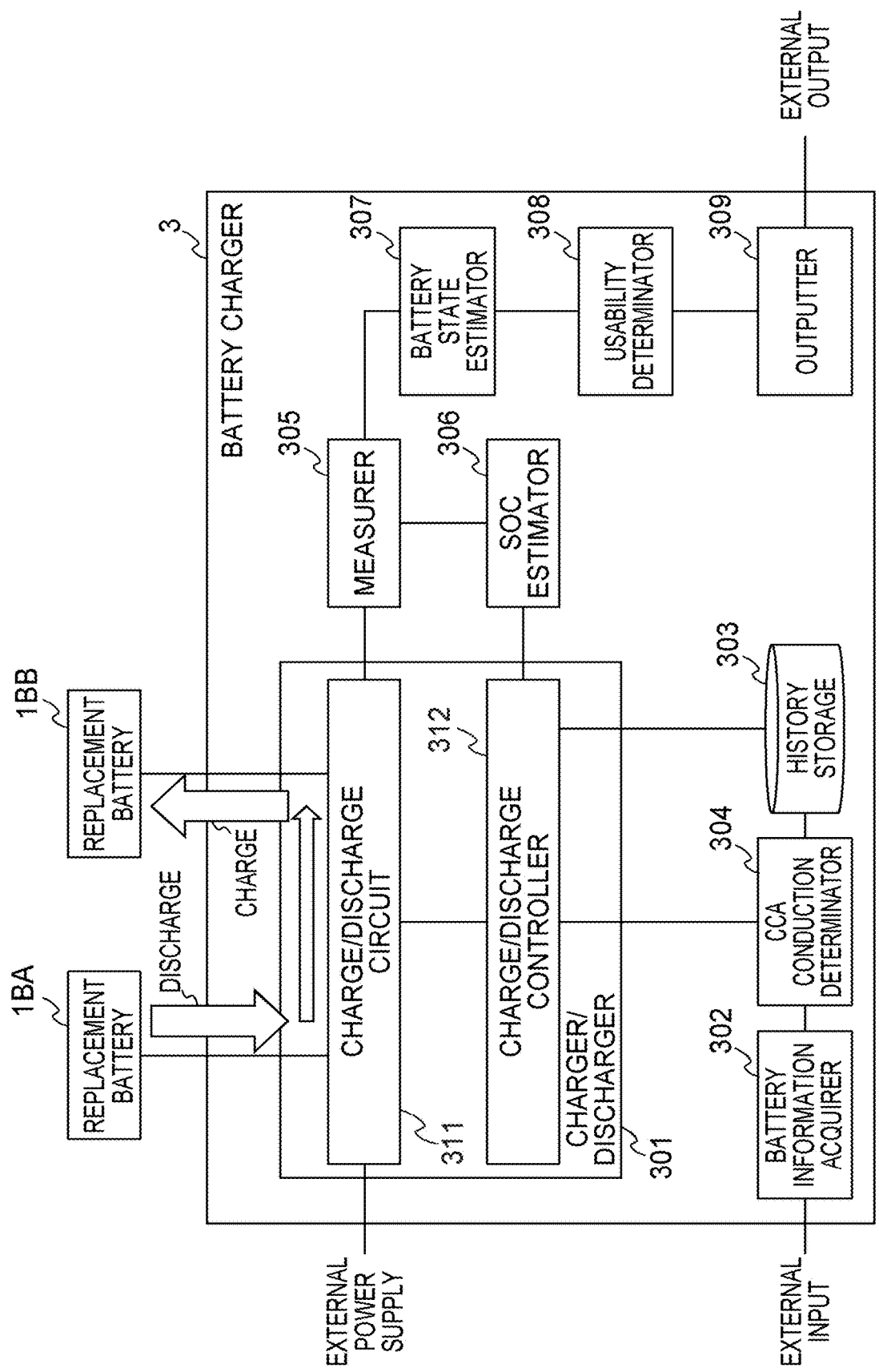
FIG. 2 is a block diagram illustrating an exemplary schematic configuration of the battery charger according to the embodiment of the present invention.

An internal configuration of the battery charger 3 will be described. FIG. 2 is a block diagram illustrating an exemplary schematic configuration of the battery charger according to the embodiment of the present invention. The battery charger 3 in the example of FIG. 2 includes a charger/discharger 301, a battery information acquirer 302, a history storage 303, a CCA conduction determinator 304, a measurer 305, a SOC estimator 306, a battery state estimator 307, a usability determinator 308, and an outputter 309. The charger/discharger 301 includes a charge/discharge circuit 311 and a charge/discharge controller 312.

The charger/discharger 301 is capable of charging and discharging the replacement battery 1B connected to the battery charger 3 and performs charging or discharging according to instructions from the charge/discharge controller 312 or the like. The charge/discharge circuit 311 is connected to the replacement battery 1B and an external power supply. The charging or discharging the replacement battery 1B is performed by controlling a current flowing through the charge/discharge circuit 311. It is assumed that the replacement battery 1B is connected to the charge/discharge circuit 311 via a plug or the like when stored in the battery charger 3.

The charge/discharge controller 312 gives a charge or discharge instruction to the charge/discharge circuit 311. Normally, the charge/discharge controller 312 gives a charge instruction to the charge/discharge circuit 311 when the replacement battery 1B is connected to the battery charger 3. However, if the CCA conduction determinator 304 determines that charging curve analysis be conducted, the charge/discharge controller 312 can give a discharge instruction depending on the situation. Details will be described later.

The battery information acquirer 302 acquires information about the replacement battery 1B to be charged. This information will be referred to as battery information. The battery information contains at least an identifier of the replacement battery 1B.

For example, it is conceivable that a bar code reader reads the bar code attached to the replacement battery 1B to acquire the identifier of the replacement battery 1B. In that case, the bar code reader corresponds to the battery information acquirer 302. Alternatively, a RFID tag configured to wirelessly transmit the identifier of the replacement battery 1B may be attached to the replacement battery 1B, and the identifier of the replacement battery 1B may be acquired by receiving radio waves from the RFID tag. In that case, a wireless communications device capable of wirelessly receiving the radio waves corresponds to the battery information acquirer 302. Alternatively, it is conceivable that the identifier of the replacement battery 1B is inputted to an input image displayed on a monitor and the battery information acquirer 302 acquires input information. In this way, it is conceivable that the battery information acquirer 302 acquires battery information by receiving external input.

Also, the battery information contains a current SOC (State of Charge) value of the replacement battery 1B or information used to calculate this value. The value of SOC is used to determine whether to discharge the replacement battery 1B, and has been calculated, for example, by the battery-powered device 2. The battery information acquirer 302 may acquire the SOC calculated by the battery-powered device 2. Alternatively, the current SOC can be estimated on the basis of an operation history and the like recorded by the battery-powered device 2, including driving time and mileage. Therefore, the operation history may be acquired. When the operation history is acquired, the SOC estimator 306 estimates the current SOC on the basis of the operation history and the like.

The history storage 303 stores a process history of other components, such as a record of charging and discharging performed by the battery charger 3 and past CCA calculation results.

The CCA conduction determinator 304 determines whether to conduct CCA. That is, it is determined whether to estimate the deterioration state of the replacement battery 1B. Information needed to determine whether to conduct CCA is acquired from the battery information acquirer 302 and history storage 303. For example, the CCA conduction determinator 304 extracts, from the history storage 303, CCA conduction history of the replacement battery 1B of which the identifier is acquired from the battery information acquirer 302. Then, if conditions for conducting CCA related to SOC, the extracted history, and the like are satisfied, the CCA conduction determinator 304 determines to conduct CCA. Hereinafter, the conditions for conducting CCA will be referred to as CCA conduction conditions.

FIG. 3 is a diagram illustrating an example of CCA conduction conditions. In the example of FIG. 3, four CCA conduction conditions No. 1 to No. 4 are illustrated. In FIG. 3, the CCA conduction conditions are shown in descending order of priority, but it is assumed that CCA is conducted if at least one of the CCA conduction conditions is satisfied.

CCA conduction condition No. 1 is that 90 days or more have elapsed since the last CCA. That is, CCA is conducted if the elapsed period is 90 days or more. This condition is intended to ensure that CCA will be conducted periodically because deterioration progresses with the passage of time.

CCA conduction condition No. 2 is that the current SOC is 30% or less. In estimating the deterioration state using charging curve analysis on the basis of measurement data taken during charging, the greater the amount of measurement data, the better the accuracy of estimation. In the present embodiment, it is assumed that charging is continued until SOC reaches 100%. From the viewpoint of accuracy of estimation, it is preferable that the SOC at the start of charging is 30% or less. Thus, when the current SOC is 30% or less, the battery may be charged right away. When the current SOC exceeds 30%, it is preferable from the viewpoint of accuracy of estimation that the battery is charged after being discharged until the SOC becomes 30% or less. That is, when the current SOC is 30% or less, there is no need to discharge the battery. CCA conduction condition No. 2 dictates that CCA be conducted when there is no need for discharging.

CCA conduction condition No. 3 is a combination of a condition that 60 days or more have elapsed since the last CCA and a condition that the current SOC is 40% or less. When both the conditions are satisfied, CCA is conducted. CCA conduction condition No. 3 is intended to conduct CCA before the elapsed period reaches 90 days if discharged capacity is low. CCA conduction condition No. 4 is similar to CCA conduction condition No. 3.

When it is determined to conduct CCA in this way, the charge/discharge controller 312 receives a notice that CCA will be conducted and controls the charge/discharge circuit 311 such that the replacement battery 1B of which current SOC exceeds a predetermined threshold will be discharged until the current SOC falls to or below the predetermined threshold and will be then charged.

Discharged power may be used to charge another replacement battery 1B. The battery charger 3 manages plural replacement batteries 1B. As shown in FIG. 2, there can be a situation in which a replacement battery 1BA, which is one of the replacement batteries 1B, is being discharged while a replacement battery 1BB, which is one of the replacement batteries 1B, is being charged. In such a case, the charge/discharge circuit 311 can use the discharged power to charge a replacement battery 1B different from the discharged replacement battery 1B. This makes it possible to do charging effectively without wasting the discharged power.

The measurer 305 measures voltage and current of the replacement battery 1B during charging or discharging and generates measurement data. That is, the measurement data includes at least the voltage of the replacement battery 1B and current flowing through the replacement battery 1B during charging or discharging. More precisely, the voltage of the replacement battery 1B is a voltage between positive and negative terminals in the replacement battery 1B. Besides, the measurement data may include other data such as temperature of the replacement battery 1B during charging or discharging.

On the basis of measurement data, the SOC estimator 306 calculates the current SOC value of the replacement battery 1B during charging or discharging. For example, it is conceivable to calculate the current SOC value by (i) calculating an integrated value of the current flowing through the replacement battery 1B during charging or discharging and (ii) adding or subtracting the integrated value to/from the SOC value measured at the time when the replacement battery 1B is connected to the battery charger 3. The current SOC value thus calculated is used by the charge/discharge controller 312 in determining whether to stop charging or discharging.

The battery state estimator 307 estimates the current deterioration state of the replacement battery 1B using charging curve analysis. Using the charging curve analysis, an internal state parameter and battery characteristics of the replacement battery 1B are calculated on the basis of measurement data. Specifically, the internal state parameter is estimated on the basis of the measurement data. The battery characteristics are estimated on the basis of the estimated internal state parameter. It is enough that what indicating the deterioration state are selected in advance and calculated by the charging curve analysis. If unnecessary, the battery characteristics do not need to be calculated.

The internal state parameter represents a state of the replacement battery 1B. It is assumed that the internal state parameter includes positive electrode capacity, negative electrode capacity, SOC deviation, and internal resistance. The positive electrode capacity may be the mass of the positive electrode and the negative electrode capacity may be the mass of the negative electrode. The SOC deviation means a difference in initial charge level between the positive electrode and negative electrode.

The battery characteristics, which can be calculated from the internal state parameter, represent characteristics such as the voltage of the replacement battery 1B. The battery characteristics include battery capacity, an open circuit voltage (OCV), and an OCV curve. The battery characteristics also include internal resistance. The OCV curve is a graph, i.e., a function that represents a relationship between some index of the replacement battery 1B and the open circuit voltage. The battery capacity has a range that corresponds to an overlap between a positive electrode capacity range and a negative electrode capacity range.

Details of the charging curve analysis is made known by Japanese Patent Laid-Open No. 2017-166874 and the like and the internal state parameter and battery characteristics can be calculated based on the charging curve analysis using a known technique.

The usability determinator 308 determines whether or not the replacement battery 1B is usable, on the basis of the estimated deterioration state. For example, the positive electrode capacity and negative electrode capacity are set in advance as parameters of the deterioration state. Then, it is conceivable that the replacement battery 1B is determined to be usable if at least one of two conditions is satisfied: a first condition that the positive electrode capacity is lower than a predetermined threshold and a second condition that the negative electrode capacity is lower than a predetermined threshold. Alternatively, it is conceivable that the replacement battery 1B is determined as unusable when a third condition that a difference between the positive electrode capacity and negative electrode capacity is larger than a predetermined threshold is satisfied. Generally, it is preferable that the positive electrode capacity and negative electrode capacity decrease in a balanced manner. If the positive electrode capacity decreases unilaterally, problems tend to be caused, such as swelling of the replacement battery 1B by generated gas. On the other hand, if the negative electrode capacity decreases unilaterally, problems tend to be caused, such as precipitation of lithium. Therefore, it is conceivable to establish conditions such as described above.

Also, for example, the usability determinator 308 estimates an amount of heat generated by the replacement battery 1B on the basis of the current internal state parameter or battery characteristics, and then estimates a raised temperature of the replacement battery 1B resulting from the amount of heat, on the basis of the specific heat of the replacement battery 1B. Then, it is conceivable to determine whether or not the replacement battery 1B is usable by evaluating safety of the replacement battery 1B on the basis of the raised temperature. In this way, for determining whether or not the replacement battery 1B is usable, the usability determinator 308 may perform arithmetic operations based on the estimated state of deterioration. In other words, for determining whether or not the replacement battery 1B is usable, the usability determinator 308 may perform arithmetic operations based on the calculated internal state parameter or battery characteristics.

The outputter 309 outputs information about the determined usability. This information is sufficient if whether or not the replacement battery 1B is usable is recognized, and there is no particular limit on an output form. For example, if the battery charger 3 is connected with a display, speaker or the like via the outputter 309, images or light indicating usability of the replacement batteries 1B connected to the battery charger 3 may be displayed on the display and warning beeps may be outputted through the speaker. Alternatively, in order to disable removal of any replacement battery 1B determined as unusable, a control signal intended to lock connection between the replacement battery 1B and battery charger 3 may be outputted to a device managing the connection. Also, to allow a manager or the like of the battery charger 3 to recognize any unusable replacement battery 1B, a file or e-mail containing an identifier of the unusable replacement battery 1B may be outputted. In this way, the outputter produces external outputs.

Note that there is no particular limit to the information outputted from the outputter 309. For example, information about various processes of the battery charger, such as measurement data, the internal state parameter, and battery characteristics, may be outputted.

Figure 4:
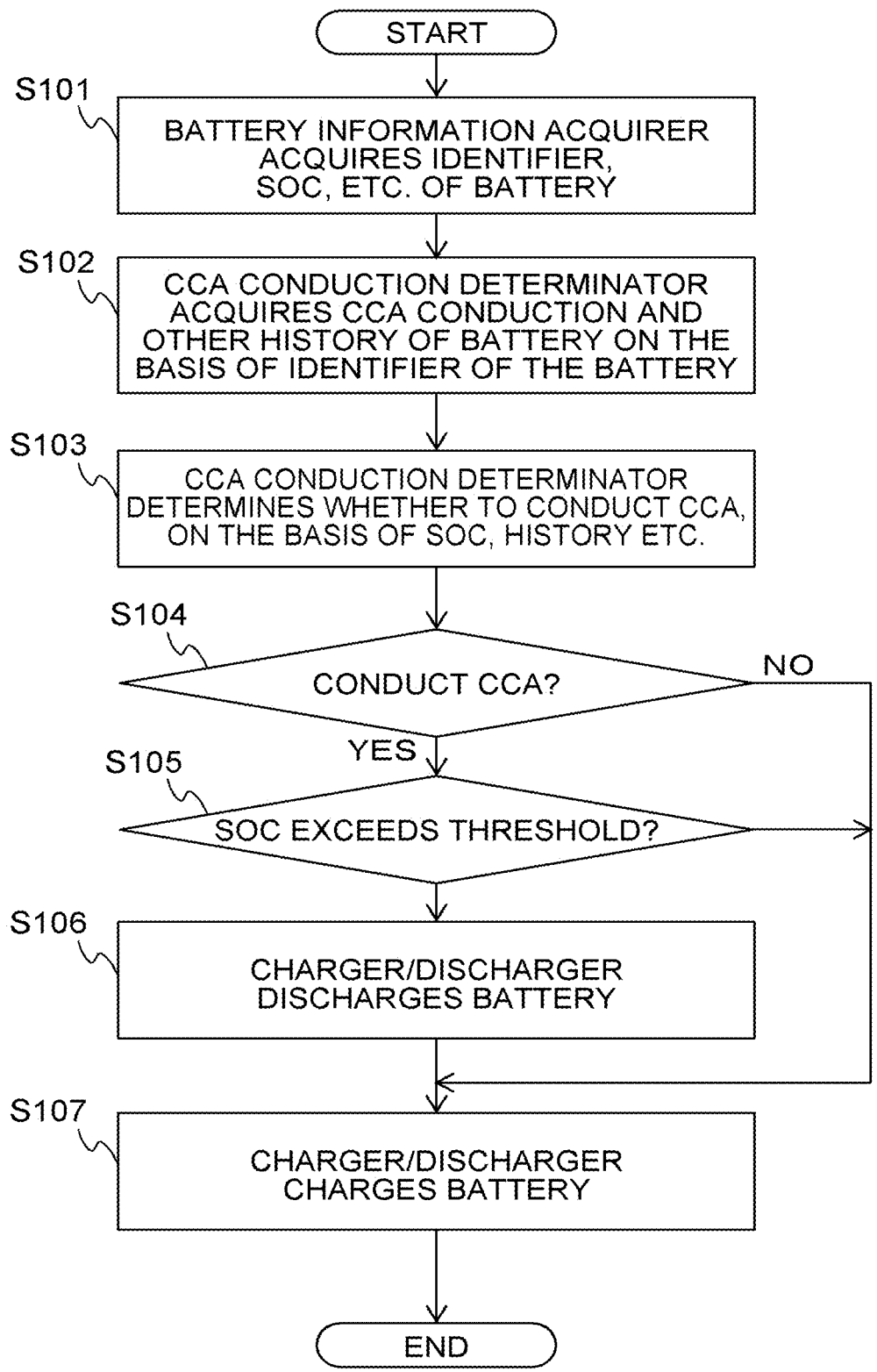
FIG. 4 is a flowchart illustrating an exemplary flow of a charging process.

Next, a process flow of the battery charger 3 will be described. FIG. 4 is a flowchart illustrating an exemplary flow of a charging process. Note that the flowchart is only an example, and the processing order and the like are not limited as long as necessary process results are available. Also, the process results may be stored sequentially in a storage such as the history storage 303, and each component may acquire process results with reference to the storage. This similarly applies to subsequent flowcharts.

The battery information acquirer 302 acquires information needed to determine whether to conduct CCA, such as the identifier and SOC of the replacement battery 1B (S101). On the basis of the acquired identifier of the replacement battery 1B, the CCA conduction determinator 304 acquires a history of the replacement battery 1B from the history storage 303 (S102). It is assumed that the history includes, for example, dates on which CCA was conducted on the battery 1. On the basis of the acquired SOC, history, and the like, the CCA conduction determinator 304 determines whether CCA conduction conditions such as shown in FIG. 3 are satisfied and thereby determines whether to conduct CCA (S103).

Information as to whether to conduct CCA is send to the charge/discharge controller 312, which then controls the charge/discharge circuit according to whether to conduct CCA. Specifically, when CCA is conducted (YES in S104) and acquired SOC exceeds a predetermined threshold (YES in S105), the charger/discharger discharges the battery first (S106) and then charges the battery (S107). When CCA is not conducted (NO in S104) or when CCA is conducted (YES in S104) but acquired SOC does not exceeds the predetermined threshold (NO in S105), only charging is performed (S107). In this way, charging of the replacement battery 1B is completed.

Figure 5:
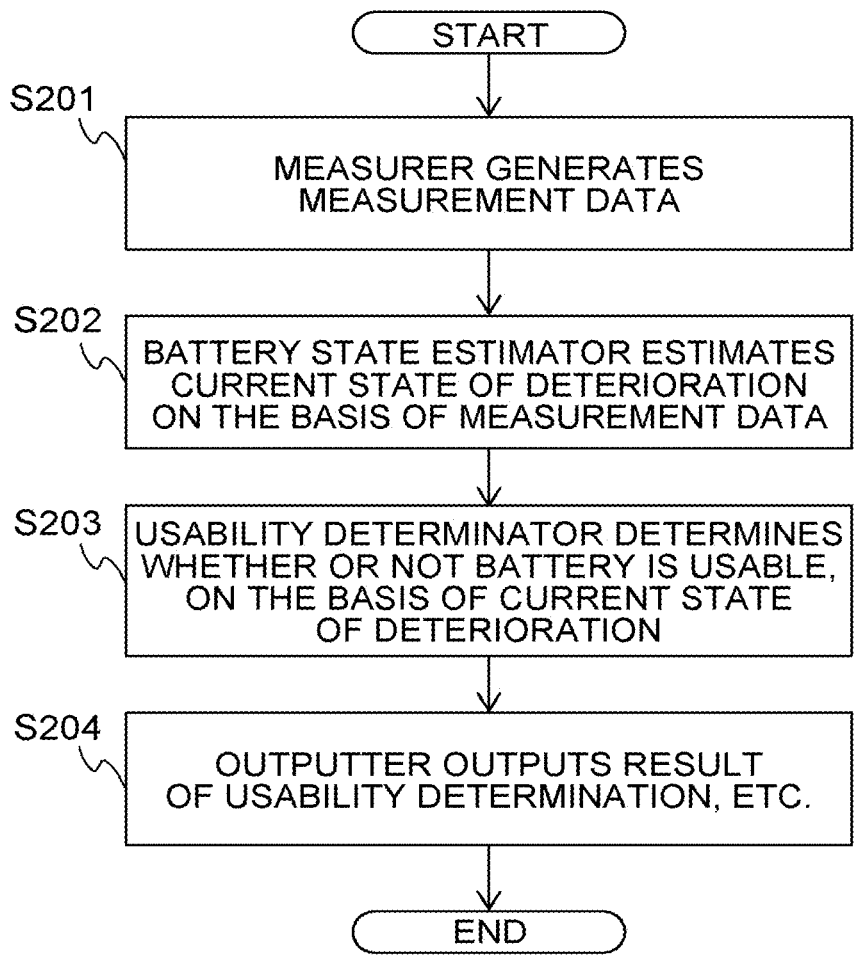
FIG. 5 is a flowchart illustrating an exemplary flow of determining based on CCA whether or not a replacement battery is usable.

FIG. 5 is a flowchart illustrating an exemplary flow of determining based on CCA whether or not a replacement battery is usable. The measurer 305 measures current and voltage during the charging shown in S107 of FIG. 4 and generates measurement data (S201). The battery state estimator 307 calculates the internal state parameter of the replacement battery 1B from the measurement data. If battery characteristics need calculating, the battery characteristics are calculated on the basis of the internal state parameter. The current deterioration state is estimated in this way (S202). On the basis of the internal state parameter or battery characteristics, the usability determinator 308 determines whether or not the replacement battery 1B is usable (S203).

Then, the outputter 309 outputs the result of usability determination in such a way that the result can be recognized by the manager of the battery charger, the user of the battery provision system, and the like (S204). As described above, there is no particular limit to the output method, and an image indicating whether or not the battery is usable may be displayed on a monitor, or the connection between the replacement battery 1B and battery charger 3 may be locked to disable removal of the replacement battery 1B determined as unusable. In this way, the replacement battery 1B determined as unusable is prevented from being used.

Thus, according to the present embodiment, using the measurement data taken during charging of the replacement battery 1B, the state of the replacement battery 1B including deterioration is estimated. Then, on the basis of the estimated deterioration state and the like, it is determined whether or not the replacement battery 1B is usable. This makes it possible to reduce the time taken for preparation of the replacement battery 1B compared to conventional techniques whereby charging and safety checking of the replacement battery 1B are done separately.

Also, according to the present embodiment, discharging could be done on the basis of the current SOC. This guarantees accuracy in estimating the deterioration state. Also, using the current discharged from a replacement battery 1B, another replacement battery 1B is charged. This prevents reduction in charging efficiency.

Note that at least part of the above embodiment may be implemented by hardware, i.e., by a dedicated electronic circuit such as an IC (Integrated Circuit) packing a processor, memory, and the like. Also, at least part of the above embodiment may be implemented by software, i.e., by executing a program. The above processes of the embodiment can be implemented by using, for example, a general-purpose computer device as basic hardware and causing a processor such as a central processing unit (CPU) mounted in the computer device to execute the program.

For example, by reading dedicated software stored in a computer-readable storage medium, a computer can be caused to function as the apparatus of the above embodiment. There is no particular limit to the type of storage medium. Also, if dedicated software downloaded via a communication network is installed on a computer, the computer can be caused to function as the apparatus of the above embodiment. In this way, software-based information processing is implemented concretely using hardware resources.

Figure 6:
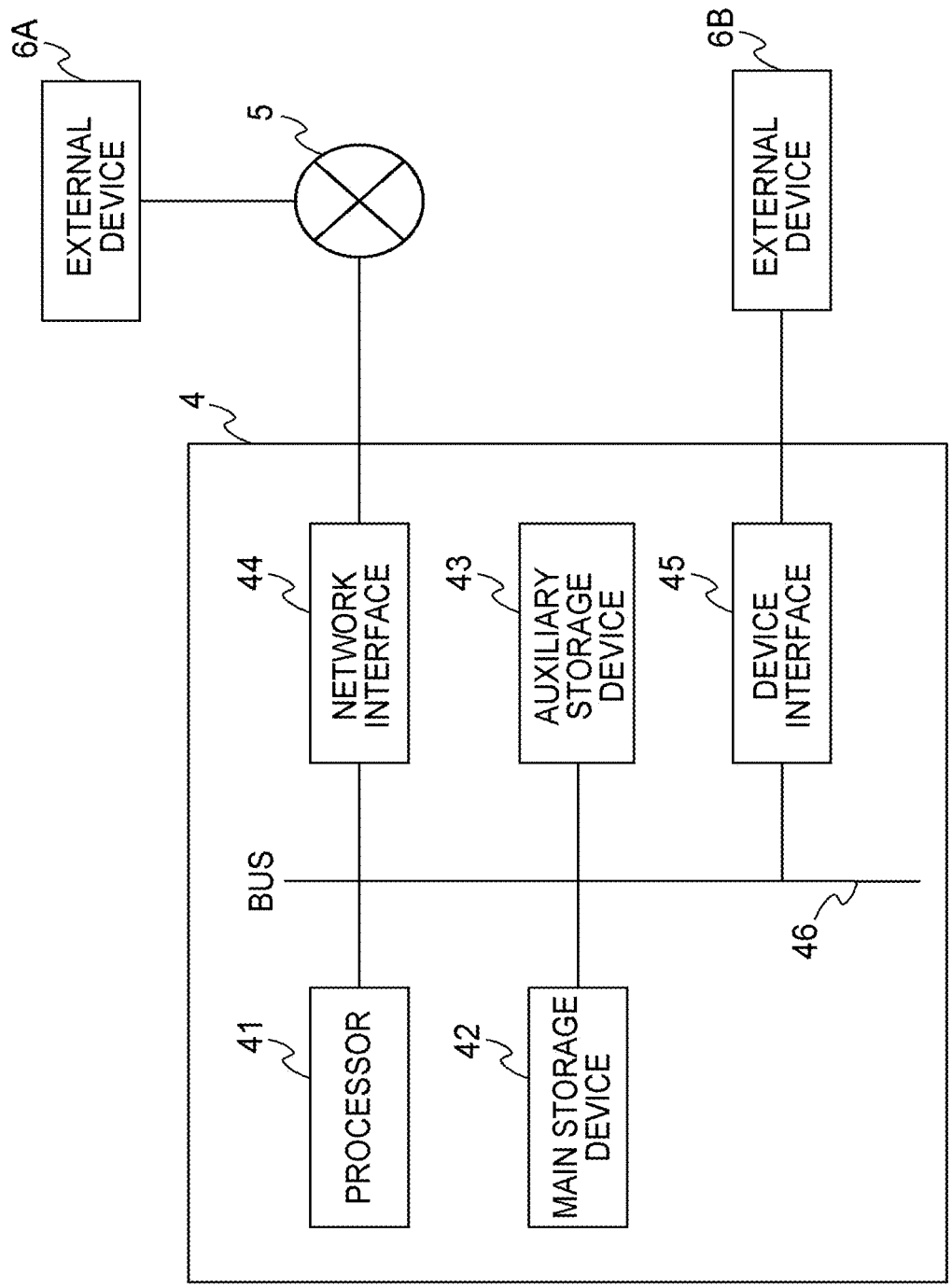
FIG. 6 is a block diagram illustrating an example of a hardware configuration according to the embodiment of the present invention.

FIG. 6 is a block diagram illustrating an example of a hardware configuration according to the embodiment of the present invention. The battery charger 3 includes a processor 41, a main storage device 42, an auxiliary storage device 43, a network interface 44, and a device interface 45 and can be implemented as a computer device 4 in which these components are interconnected via a bus 46.

Note that the computer device 4 of FIG. 6 includes one each of the components, but may include multiple items of the same component. Also, whereas FIG. 6 illustrates a single computer device 4, software may be installed on plural computer devices such that the plural computer devices will perform different processes of the software, respectively.

The processor 41 is an electronic circuit including a control device and an arithmetic device of the computer. The processor performs arithmetic processing on the basis of data or programs inputted from various devices inside the computer device 4 and outputs computational results and control signals to various devices. Specifically, the processor 41 runs an OS (Operating System) of the computer device 4 or applications and controls various devices of the computer device 4. There is no particular limit to the processor 41 as long as the processor 41 can perform the above processes. The processes of the battery charger 3 can be implemented by the processor 41.

The main storage device 42 stores commands executed by the processor 41 as well as various data and information stored in the main storage device 42 is read directly by the processor 41. The auxiliary storage device 43 is a storage device other than the main storage device 42. Note that the storage devices mean any electronic components capable of storing electronic information and may be either memory or storage. Also, there are volatile memory and non-volatile memory, either of which may be used. A storage such as a history DB may be implemented by either the main storage device 42 or auxiliary storage device 43.

The network interface 44 is used to connect to a communication network 5 by radio or by wire. Any network interface 44 compatible with existing communication standards may be used. Through the network interface 44, information may be exchanged with an external device 6A connected on-line via the communication network 5.

Examples of the external device 6A include external sensors. Also, the external device 6A may be a device having some of process functions of the battery charger 3. Examples include a cloud server configured to provide necessary data. That is, the computer device 4 may receive necessary data using a cloud service via the communication network 5.

The device interface 45 is an interface such as USB connecting directly to an external device 6B. The external device 6B may be either an external storage medium or a storage device such as a database.

The external device 6B may be an output device. The output device may be, for example, a display device used to display images or a device configured to output voice and the like. Examples include, but are not limited to, an LCD (Liquid Crystal Display), CRT (Cathode Ray Tube), PDP (Plasma Display Panel), and speaker.

Note that the external device 6B may be an input device. The input device includes a keyboard, a mouse, a touch panel, and other devices and provides information inputted via these devices to the computer device 4. A signal from the input device is outputted to the processor 41.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A battery charger comprising:
   a charger/discharger capable of charging and discharging a connected battery;
   a measurer configured to measure voltage and current of the connected battery during charging and generate measurement data;
   a battery state estimator configured to estimate a deterioration state of the connected battery on the basis of the measurement data;
   a determinator configured to determine whether or not the connected battery is usable, on the basis of the estimated deterioration state of the connected battery; and
   an outputter configured to output information about determined usability, and
   wherein when a state of charge of a connected battery to be charged exceeds a predetermined threshold, the charger/discharger discharges and then charges the connected battery.

2. The battery charger according to claim 1, further comprising:
   an acquirer configured to acquire an identifier of the connected battery;
   a storage configured to store a processing history of the charger/discharger with respect to the connected battery; and
   a determinator configured to determine whether to estimate the deterioration state of the connected battery on the basis of the processing history extracted from the storage, the processing history corresponding to the identifier of the connected battery, wherein
   when the deterioration state of the connected battery is estimated, it is determined whether or not the connected battery is usable.

3. A battery charger comprising:
   a charger/discharger capable of charging and discharging a connected battery;
   a measurer configured to measure voltage and current of the connected battery during charging and generate measurement data;
   a battery state estimator configured to estimate a deterioration state of the connected battery on the basis of the measurement data;
   a determinator configured to determine whether or not the connected battery is usable, on the basis of the estimated deterioration state of the connected battery; and
   an outputter configured to output information about determined usability, and
   wherein when a state of charge of a first battery which is connected to the battery charger and which is to be charged exceeds a predetermined threshold, the charger/discharger (i) discharges the first battery, (ii) uses discharged power from the first battery to charge a second battery which is another battery connected to the battery charger and which is to be charged, and (iii) charge the first battery more than the discharged power after the charging the second battery.

4. A charging method comprising:
   charging a connected battery;
   measuring voltage and current of the connected battery during charging and generate measurement data;
   estimating a deterioration state of the connected battery on the basis of the measurement data;

determining whether or not the connected battery is usable, on the basis of the estimated deterioration state of the connected battery; and outputting information about determined usability, and wherein when a state of charge of a connected battery to be charged exceeds a predetermined threshold, performing discharge and then performing charge the connected battery.

5. A non-transitory storage medium storing a program configured to cause a computer to:

charge a connected battery;

measure voltage and current of the connected battery during charging and generate measurement data;

estimate a deterioration state of the connected battery on the basis of the measurement data;

determine whether or not the connected battery is usable, on the basis of the estimated deterioration state of the connected battery; and output information about determined usability, and wherein when a state of charge of a connected battery to be charged exceeds a predetermined threshold, performing discharge and then performing charge the connected battery.

6. A battery provision system that provides a charged battery to a battery-powered device, the system comprising:

a plurality of batteries; and a battery charger configured to charge a connected battery, wherein the battery charger includes:

a charger/discharger capable of charging and discharging the connected battery;

a measurer configured to measure voltage and current of the connected battery during charging and generate measurement data;

a battery state estimator configured to estimate a deterioration state of the connected battery on the basis of the measurement data;

a determinator configured to determine whether or not the connected battery is usable, on the basis of the estimated deterioration state of the connected battery; and an outputter configured to output information about determined usability, and wherein when a state of charge of a connected battery to be charged exceeds a predetermined threshold, the charger/discharger discharges and then charges the connected battery.

* * * * *